US012618148B2

(12) United States Patent
Otani et al.

(10) Patent No.: US 12,618,148 B2
(45) Date of Patent: May 5, 2026

(54) DEPOSITION METHOD AND DEPOSITION APPARATUS

(71) Applicant: Tokyo Electron Limited, Tokyo (JP)

(72) Inventors: Muneyuki Otani, Tokyo (JP); Akira Matsubara, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 390 days.

(21) Appl. No.: 18/332,971

(22) Filed: Jun. 12, 2023

(65) Prior Publication Data

US 2023/0407466 A1      Dec. 21, 2023

(30) Foreign Application Priority Data

Jun. 16, 2022     (JP) ................................. 2022-097230

(51) Int. Cl.
| | |
|---|---|
| *C23C 16/40* | (2006.01) |
| *C23C 16/455* | (2006.01) |
| *H10P 14/60* | (2026.01) |
| *H10P 14/692* | (2026.01) |
| *H10P 72/76* | (2026.01) |

(52) U.S. Cl.
CPC ...... *C23C 16/401* (2013.01); *C23C 16/45527* (2013.01); *H10P 14/6339* (2026.01); *H10P 14/69215* (2026.01); *H10P 72/7621* (2026.01)

(58) Field of Classification Search
CPC .................................................. C23C 16/401
See application file for complete search history.

(56) References Cited

U.S. PATENT DOCUMENTS

2017/0335453 A1 * 11/2017 Miura ................... C23C 16/402

FOREIGN PATENT DOCUMENTS

| JP | 2017-212246 | 11/2017 |
|---|---|---|
| JP | 2019016778 A * | 1/2019 |
| JP | 2020-198390 | 12/2020 |
| JP | 2021-052033 | 4/2021 |
| JP | 2021-125590 | 8/2021 |

OTHER PUBLICATIONS

Shiliang Liu, Mingzhe Zhang, Baokun Huang, Nannan Wu, and Shunli Ouyang, Raman Spectroscopy for the Competition of Hydrogen Bonds in Ternary (H2O-THF-DMSO) Aqueous Solutions by Molecules 2019, 24(20), 3666; https://doi.org/10.3390/molecules24203666 (Year: 2019).*
ShiliangLiu, MingzheZhang, BaokunHuang, NannanWu, and ShunliOuyang, RamanSpectroscopyfortheCompetitionof HydrogenBondsinTernary(H2O-THF-DMSO)Aqueous-SolutionsbyMolecules 2019,24(20),3666;https://doi.org/10.3390/molecules24203666 (Year: 2019).*

* cited by examiner

*Primary Examiner* — Brent A. Fairbanks
*Assistant Examiner* — Krishna J Palaniswamy
(74) *Attorney, Agent, or Firm* — IPUSA, PLLC

(57) ABSTRACT

A deposition method includes: (a) preparing a substrate with a recess on a surface thereof; (b) supplying an organic raw material gas to the surface to adsorb the organic raw material gas to the recess; (c) supplying an oxygen-containing gas to the surface to oxidize the organic raw material gas adsorbed to the recess; and (d) after the (c), supplying a first gas containing a dehydrating agent to the surface.

7 Claims, 11 Drawing Sheets

FIG.11

|  | CONDITION 1 | CONDITION 2 | CONDITION 3 | CONDITION 4 |
|---|---|---|---|---|
| THF FLOW RATE [SLM] | 1 | 1 | 1 | 0 |
| $N_2$ FLOW RATE [SLM] | 3 | 5 | 10 | 3 |
| OVERHANG | 118% | 118% | 111% | 120% |
| STEP COVERAGE | 84% | 87% | 96% | 71% |

DEPOSITION METHOD AND DEPOSITION APPARATUS

CROSS-REFERENCE TO RELATED APPLICATIONS

The present application is based on and claims priority to Japanese Patent Application No. 2022-097230 filed on Jun. 16, 2022, the contents of which are incorporated herein by reference in their entirety.

BACKGROUND OF THE INVENTION

Field of the Invention

The present disclosure relates to a deposition method and a deposition apparatus.

Description of the Related Art

A technique is known to perform deposition by the atomic layer deposition method while adjusting the amount of OH groups by supplying an additive gas that can control the adsorption of the raw material gas prior to adsorption of the raw material gas (see, for example, Japanese Laid-Open Patent Publication No. 2017-212246).

SUMMARY OF THE INVENTION

According to one aspect of the present disclosure, a deposition method includes: (a) preparing a substrate with a recess on a surface thereof; (b) supplying an organic raw material gas to the surface to adsorb the organic raw material gas to the recess; (c) supplying an oxygen-containing gas to the surface to oxidize the organic raw material gas adsorbed to the recess; and (d) after the (c), supplying a first gas containing a dehydrating agent to the surface.

BRIEF DESCRIPTION OF THE DRAWINGS

FIG. 11 is a diagram illustrating the evaluation results of the embedding characteristics of the silicon oxide film.

DESCRIPTION OF THE EMBODIMENTS

Figure 1:
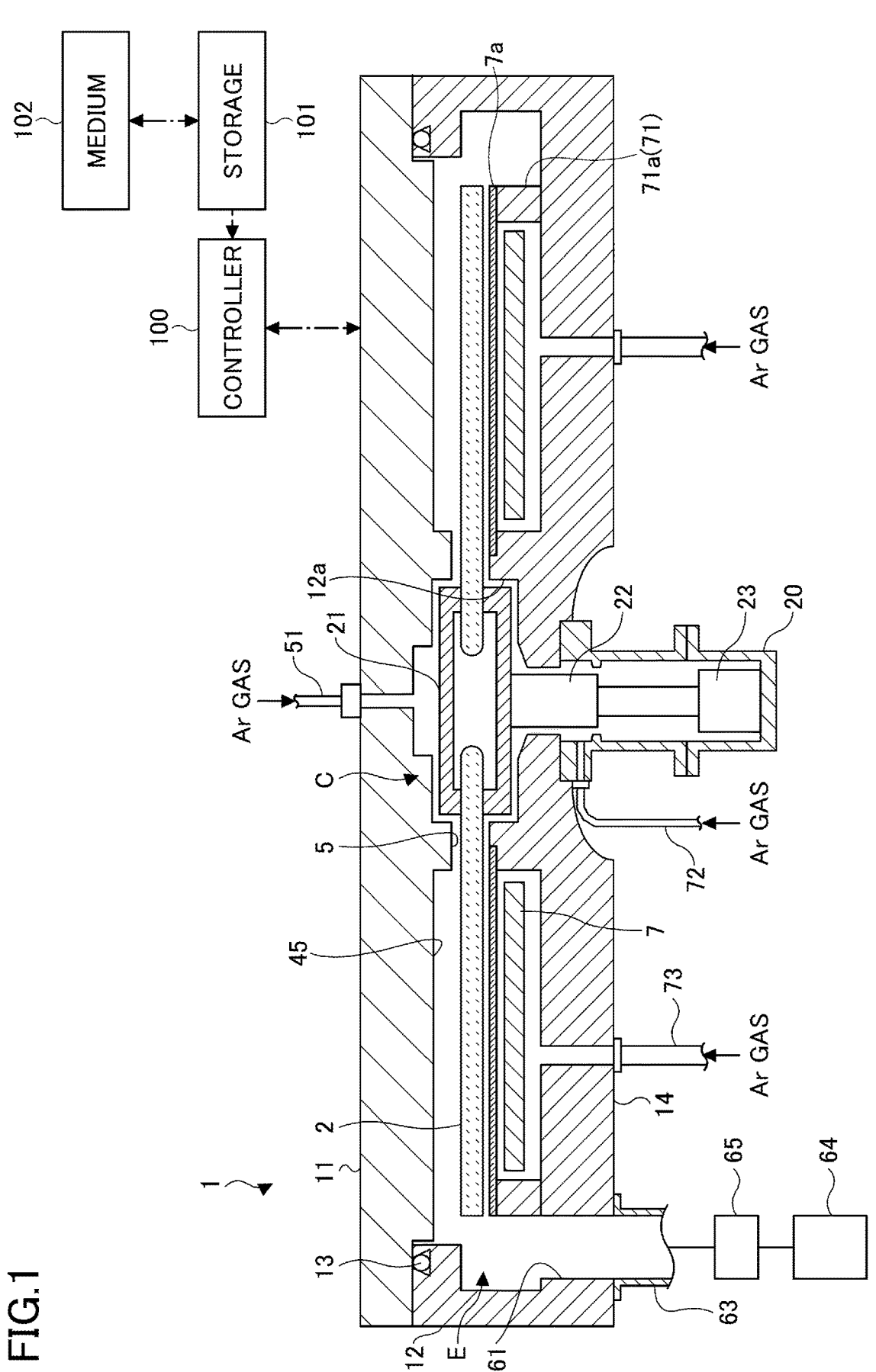
FIG. 1 is a cross-sectional view illustrating a configuration example of a deposition apparatus according to an embodiment.

Hereinafter, non-limiting exemplary embodiments of the present disclosure will be described with reference to the accompanying drawings. In all accompanying drawings, the same or corresponding members or parts are denoted by the same or corresponding reference numerals, and overlapping descriptions are omitted.

[Deposition Apparatus]

Figure 2:
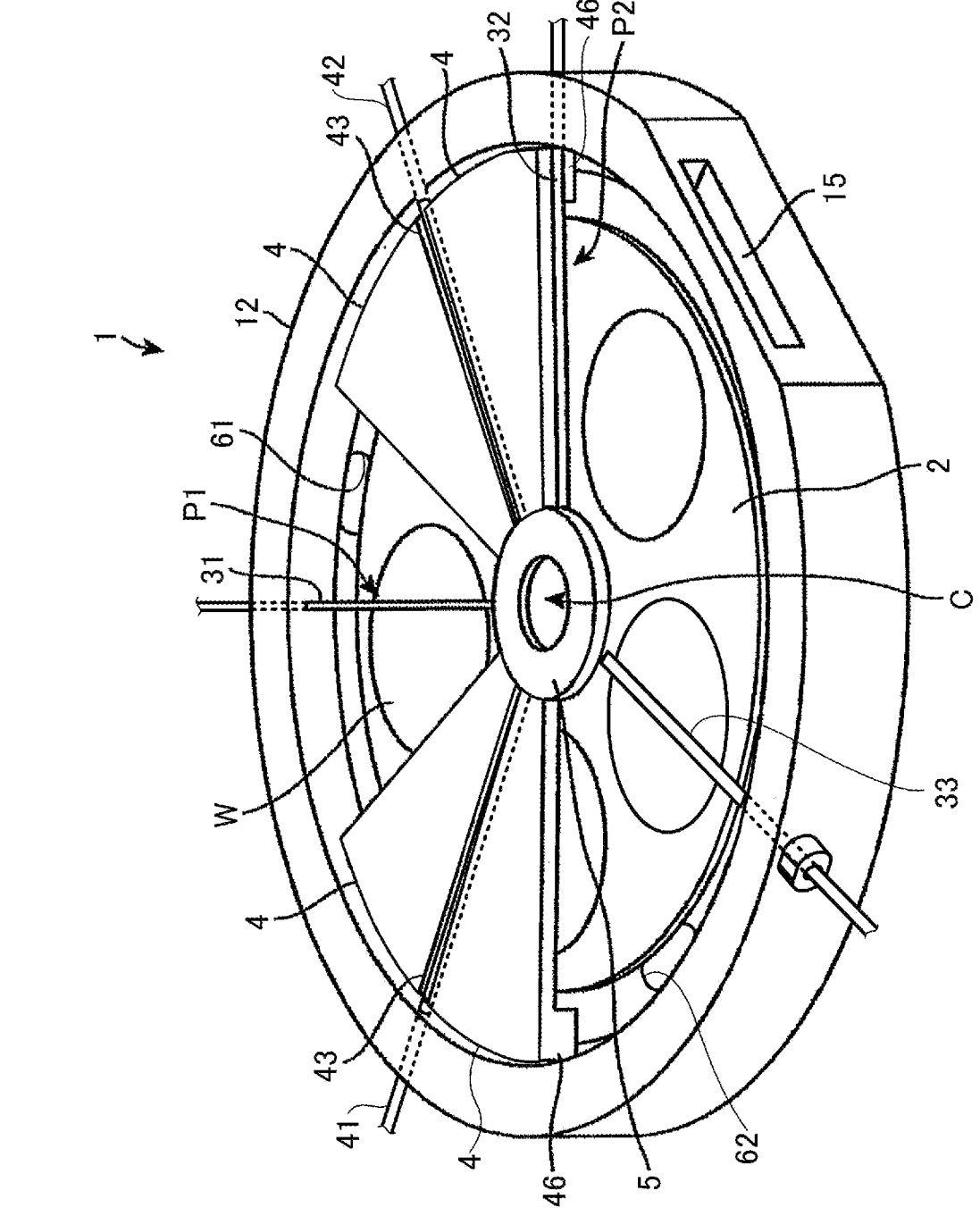
FIG. 2 is a perspective view illustrating an internal configuration of the deposition apparatus of FIG. 1.
Figure 3:
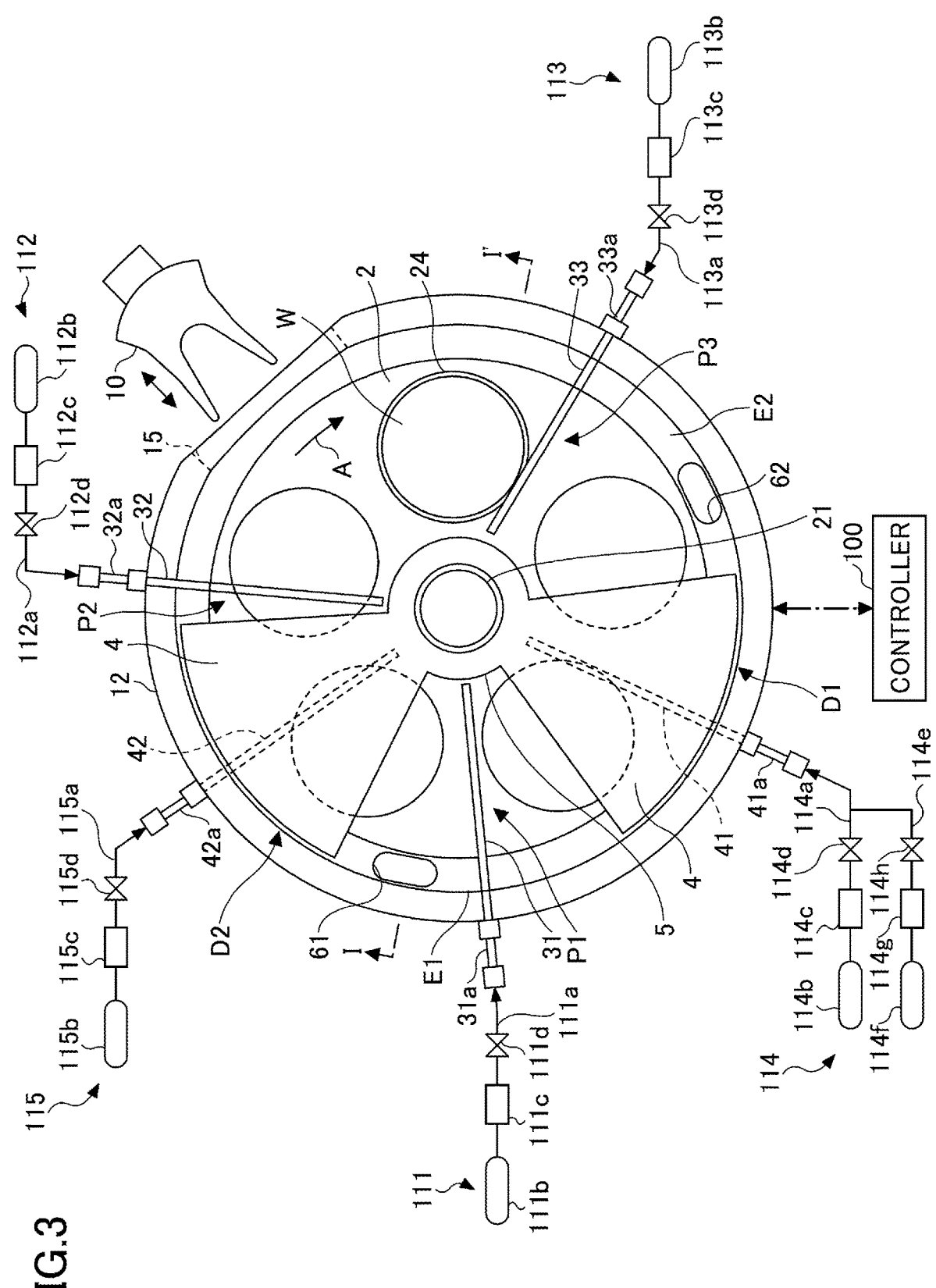
FIG. 3 is a planar view illustrating an internal configuration of the deposition apparatus of FIG. 1.

Referring to FIGS. 1 to 5, a deposition apparatus according to an embodiment will be described. As illustrated in FIGS. 1 to 3, the deposition apparatus includes a flat vacuum chamber 1 having an approximately circular planar shape and a rotary table 2 provided in the vacuum chamber 1 and having a rotation center at the center of the vacuum chamber 1. The vacuum chamber 1 includes a chamber body 12 having a cylindrical shape with a bottom and a top plate 11 that is hermetically detachably provided on the top surface of the chamber body 12 via a sealing member 13 (FIG. 1) such as an O-ring, for example.

The rotary table 2 is fixed to a cylindrical core 21 at the center. The core 21 is fixed to the upper end of a rotating shaft 22 extending in the vertical direction. The rotating shaft 22 penetrates the bottom 14 of the vacuum chamber 1, and its lower end is attached to a driver 23 that rotates the rotating shaft 22 (FIG. 1) around a vertical axis. The rotating shaft 22 and the driver 23 are accommodated in a cylindrical case body 20 with an open top surface. The case body 20 is hermetically attached to the lower surface of the bottom 14 of the vacuum chamber 1 by a flange provided on its top surface, and the hermetic state between the internal and external atmospheres of the case body 20 is maintained.

On the surface of the rotary table 2, circular recesses 24 are provided for placing a plurality of substrates W (five in the illustrated example) along the rotation direction (circumferential direction) as illustrated in FIGS. 2 and 3. In FIG. 3, the substrate W is illustrated in only one recess 24 for convenience. The substrate W may be, for example, a semiconductor wafer. The recess 24 has an inner diameter slightly larger than the diameter of the substrate W and a depth approximately equal to the thickness of the substrate W. When the substrate W is accommodated in the recess 24, the surface of the substrate W and the surface of the rotary table 2 (the area where the substrate W is not placed) are at the same height. The bottom surface of the recess 24 is formed with through holes (none of which are illustrated) through which, for example, three lifting pins are penetrated for supporting the back surface of the substrate W and lifting the substrate W.

FIGS. 2 and 3 are views illustrating the configuration in the vacuum chamber 1, and for convenience of explanation, illustration of the top plate 11 is omitted. As illustrated in FIGS. 2 and 3, reaction gas nozzles 31, 32, and 33 and separation gas nozzles 41 and 42, which are made of quartz, for example, are spaced from each other along a circumferential direction of the vacuum chamber 1 (the rotation direction of the rotary table 2 indicated by an arrow A in FIG. 3) above the rotary table 2. In the illustrated example, the reaction gas nozzle 33, the separation gas nozzle 41, the reaction gas nozzle 31, the separation gas nozzle 42, and the reaction gas nozzle 32 are provided in this order clockwise (in the rotation direction of the rotary table 2) from a loading port 15 described later. The reaction gas nozzles 31, 32, and 33 and the separation gas nozzles 41 and 42 are fixed to the outer circumferential wall of the chamber body 12 at gas introduction ports 31a, 32a, 33a, 41a, and 42a (FIG. 3), which are the proximal ends, respectively. The reaction gas nozzles 31, 32, and 33 and the separation gas nozzles 41 and 42 are introduced into the vacuum chamber 1 from the outer circumferential wall of the vacuum chamber 1, and are attached so as to extend horizontally against the rotary table 2 along the radial direction of the chamber body 12.

A plurality of discharge holes 31h and 32h (FIG. 4) opening toward the rotary table 2 are provided in the reaction gas nozzles 31 and 32 at intervals along the length direction of the reaction gas nozzles 31 and 32. Similarly, a plurality of discharge holes (not illustrated) opening toward the rotary table 2 are provided in the reaction gas nozzles 33 at intervals along the length direction of the reaction gas nozzle 33.

A plurality of discharge holes 42h (FIG. 4) opening toward the rotary table 2 are provided in the separation gas nozzle 42 at intervals along the length direction of the separation gas nozzle 42. Similarly, a plurality of discharge holes (not illustrated) opening toward the rotary table 2 are provided in the separation gas nozzle 41 at intervals along the length direction of the separation gas nozzle 41.

An organic raw material gas is introduced into the reaction gas nozzle 31 from an organic raw material gas supplier 111. The organic raw material gas supplier 111 includes an organic raw material gas supply path 111a, an organic raw material gas source 111b, a flow controller 111c, and a valve 111d. The organic raw material gas supply path 111a is provided outside the vacuum chamber 1. The organic raw material gas supply path 111a is connected to the reaction gas nozzle 31. The organic raw material gas supply path 111a is provided with the organic raw material gas source 111b, the flow controller 111c, and the valve 111d in the order from upstream to downstream in the gas flow direction. Accordingly, the organic raw material gas from the organic raw material gas source 111b is controlled in supply timing by the valve 111d, and is adjusted to a predetermined flow rate by the flow controller 111c. The organic raw material gas flows from the organic raw material gas supply path 111a into the reaction gas nozzle 31, and is discharged from the reaction gas nozzle 31 into the vacuum chamber 1. The flow controller 111c may be, for example, a mass flow controller.

The organic raw material gas may be, for example, a gas containing a metallic element, carbon, and hydrogen. The metallic element may be, for example, aluminum (Al), titanium (Ti), strontium (Sr), zirconium (Zr), and hafnium (Hf). The organic raw material gas may be, for example, tris(dimethylamino)cyclopentadienyl zirconium gas.

A plurality of reaction gas nozzles 31 may be provided at intervals in the circumferential direction of the vacuum chamber 1. In this case, the organic raw material gas supplier 111 is configured to introduce the organic raw material gas into the reaction gas nozzles 31. The region below the reaction gas nozzle 31 is an adsorption region P1 for adsorbing the organic raw material gas onto the substrate W.

An oxygen-containing gas is introduced into the reaction gas nozzle 32 from an oxygen-containing gas supplier 112. The oxygen-containing gas supplier 112 includes an oxygen-containing gas supply path 112a, an oxygen-containing gas source 112b, a flow controller 112c, and a valve 112d. The oxygen-containing gas supply path 112a is provided outside the vacuum chamber 1. The oxygen-containing gas supply path 112a is connected to the reaction gas nozzle 32. The oxygen-containing gas supply path 112a is provided with the oxygen-containing gas source 112b, the flow controller 112c, and the valve 112d in the order from upstream to downstream in the gas flow direction. Accordingly, the oxygen-containing gas from the oxygen-containing gas source 112b is controlled in supply timing by the valve 112d, and is adjusted to a predetermined flow rate by the flow controller 112c. The oxygen-containing gas flows from the oxygen-containing gas supply path 112a into the reaction gas nozzle 32, and is discharged from the reaction gas nozzle 32 into the vacuum chamber 1. The flow controller 112c may be, for example, a mass flow controller.

The oxygen-containing gas is a gas that oxidizes the organic raw material gas. The oxygen-containing gas may be, for example, a mixed gas of hydrogen ($H_2$) and oxygen ($O_2$), $O_2$ gas, water vapor ($H_2O$ gas), ozone ($O_3$) gas, a mixed gas of $H_2$ and $O_3$, nitric oxide (NO) gas, nitrous oxide ($N_2O$) gas, nitrogen dioxide ($NO_2$) gas, carbon monoxide (CO) gas, and carbon dioxide ($CO_2$) gas.

A plurality of reaction gas nozzles 32 may be provided at intervals in the circumferential direction of the vacuum chamber 1. In this case, the oxygen-containing gas supplier 112 is configured to introduce the oxygen-containing gas into the reaction gas nozzles 32. The region below the reaction gas nozzle 32 is an oxidation region P2 for oxidizing the organic raw material gas adsorbed on the substrate W in the adsorption region P1.

An oxygen-containing gas is introduced into the reaction gas nozzle 33 from an oxygen-containing gas supplier 113. The oxygen-containing gas supplier 113 includes an oxygen-containing gas supply path 113a, an oxygen-containing gas source 113b, a flow controller 113c, and a valve 113d. The oxygen-containing gas supply path 113a is provided outside the vacuum chamber 1. The oxygen-containing gas supply path 113a is connected to the reaction gas nozzle 33. The oxygen-containing gas supply path 113a is provided with the oxygen-containing gas source 113b, the flow controller 113c, and the valve 113d in the order from upstream to downstream in the gas flow direction. Accordingly, the oxygen-containing gas from the oxygen-containing gas source 113b is controlled in supply timing by the valve 113d, and is adjusted to a predetermined flow rate by the flow controller 113c. The oxygen-containing gas flows from the oxygen-containing gas supply path 113a into the reaction gas nozzle 33, and is discharged from the reaction gas nozzle 33 into the vacuum chamber 1. The flow controller 113c may be, for example, a mass flow controller.

The oxygen-containing gas may be the same as the oxygen-containing gas introduced from the oxygen-containing gas source 112b, for example. In this case, the oxygen-containing gas source 113b may be a common gas source with the oxygen-containing gas source 112b.

A plasma source (not illustrated) may be provided above the reaction gas nozzle 33. In this case, because plasma can be generated from the oxygen-containing gas introduced from the reaction gas nozzle 33 into the vacuum chamber 1, the effect of oxidizing the surface of the substrate W can be increased.

A plurality of reaction gas nozzles 33 may be provided at intervals in the circumferential direction of the vacuum chamber 1. In this case, the oxygen-containing gas supplier 113 is configured to introduce the oxygen-containing gas into the reaction gas nozzles 33. The region below the reaction gas nozzle 33 is an oxidation region P3 for oxidizing the organic raw material gas adsorbed on the substrate W in the adsorption region P1.

A separation gas and a dehydrating agent are introduced into the separation gas nozzle 41 from the separation gas supplier 114. The separation gas supplier 114 includes a separation gas supply path 114a, a separation gas source 114b, a flow controller 114c, a valve 114d, a dehydrating agent supply path 114e, a dehydrating agent source 114f, a flow controller 114g, and a valve 114h. The separation gas supply path 114a is provided outside the vacuum chamber 1. The separation gas supply path 114a is connected to the separation gas nozzle 41. The separation gas supply path 114a is provided with the separation gas source 114b, the flow controller 114c, and the valve 114d in the order from upstream to downstream in the gas flow direction. Accordingly, the separation gas from the separation gas source 114b is controlled in supply timing by the valve 114d, and is adjusted to a predetermined flow rate by the flow controller 114c. The separation gas flows from the separation gas supply path 114a into the separation gas nozzle 41, and is discharged from the separation gas nozzle 41 into the vacuum chamber 1. The flow controller 114c may be, for example, a mass flow controller.

The dehydrating agent supply path 114e is provided outside the vacuum chamber 1. The dehydrating agent supply path 114e is connected to the separation gas supply path 114a downstream of the valve 114d. The dehydrating agent supply path 114e is provided with a dehydrating agent source 114f, a flow controller 114g, and a valve 114h in the order from upstream to downstream in the gas flow direction. Accordingly, the dehydrating agent from the dehydrating agent source 114f is controlled in supply timing by the valve 114h, and is adjusted to a predetermined flow rate by the flow controller 114g. The dehydrating agent flows from the dehydrating agent supply path 114e into the separation gas nozzle 41 via the separation gas supply path 114a, and is discharged with the separation gas from the separation gas nozzle 41 into the vacuum chamber 1. The flow controller 114g may be, for example, a mass flow controller.

The separation gas may be, for example, an inert gas. The inert gas may be, for example, a rare gas such as helium (He) gas, neon (Ne) gas, or argon (Ar) gas. The inert gas may be, for example, nitrogen ($N_2$) gas.

The dehydrating agent is a gas for desorbing water adsorbed on the surface of the substrate W. The dehydrating agent may be, for example, tetrahydrofuran (THF) gas or dimethylamine gas.

A plurality of separation gas nozzles 41 may be provided at intervals in the circumferential direction of the vacuum chamber 1. In this case, the separation gas supplier 114 is configured to introduce the separation gas and the dehydrating agent into the separation gas nozzles 41. The separation gas supplier 114 may be configured to introduce the separation gas and the dehydrating agent into different separation gas nozzles 41. The region below the separation gas nozzle 41 is a separation region D1 for preventing mixing of the organic raw material gas and the oxygen-containing gas. The separation region D1 also functions as a dehydration region for desorbing $H_2O$ by the dehydrating agent.

A separation gas is introduced into the separation gas nozzle 42 from the separation gas supplier 115. The separation gas supplier 115 includes a separation gas supply path 115a, a separation gas source 115b, a flow controller 115c, and a valve 115d. The separation gas supply path 115a is provided outside the vacuum chamber 1. The separation gas supply path 115a is connected to the separation gas nozzle 42. The separation gas supply path 115a is provided with the separation gas source 115b, the flow controller 115c, and the valve 115d in the order from upstream to downstream in the gas flow direction. Accordingly, the separation gas from the separation gas source 115b is controlled in supply timing by the valve 115d, and is adjusted to a predetermined flow rate by the flow controller 115c. The separation gas flows from the separation gas supply path 115a into the separation gas nozzle 42 and is discharged from the separation gas nozzle 42 into the vacuum chamber 1. The flow controller 115c may be, for example, a mass flow controller.

The separation gas may be the same as the separation gas introduced from the separation gas source 114b, for example. In this case, the separation gas source 115b may be a common gas source with the separation gas source 114b.

A plurality of separation gas nozzles 42 may be provided at intervals in the circumferential direction of the vacuum chamber 1. In this case, the separation gas supplier 115 is configured to introduce the separation gas into the separation gas nozzles 42. The region below the separation gas nozzle 42 is a separation region D2 for preventing mixing of the organic raw material gas and the oxygen-containing gas.

With reference to FIGS. 2 and 3, two projecting portions 4 are provided in the vacuum chamber 1. The projecting portions 4 together with the separation gas nozzles 41 and 42 constitute the separation regions D1 and D2 and are attached to the back surface of the top plate 11 so as to protrude toward the rotary table 2, as described later. Each of the projecting portions 4 has a fan shape in a planar view with the apex of the fan shape being cut in an arc shape, with an inner arc connected to a protrusion 5 (described later), and an outer arc positioned along the inner circumferential surface of the chamber body 12 of the vacuum chamber 1.

Figure 4:
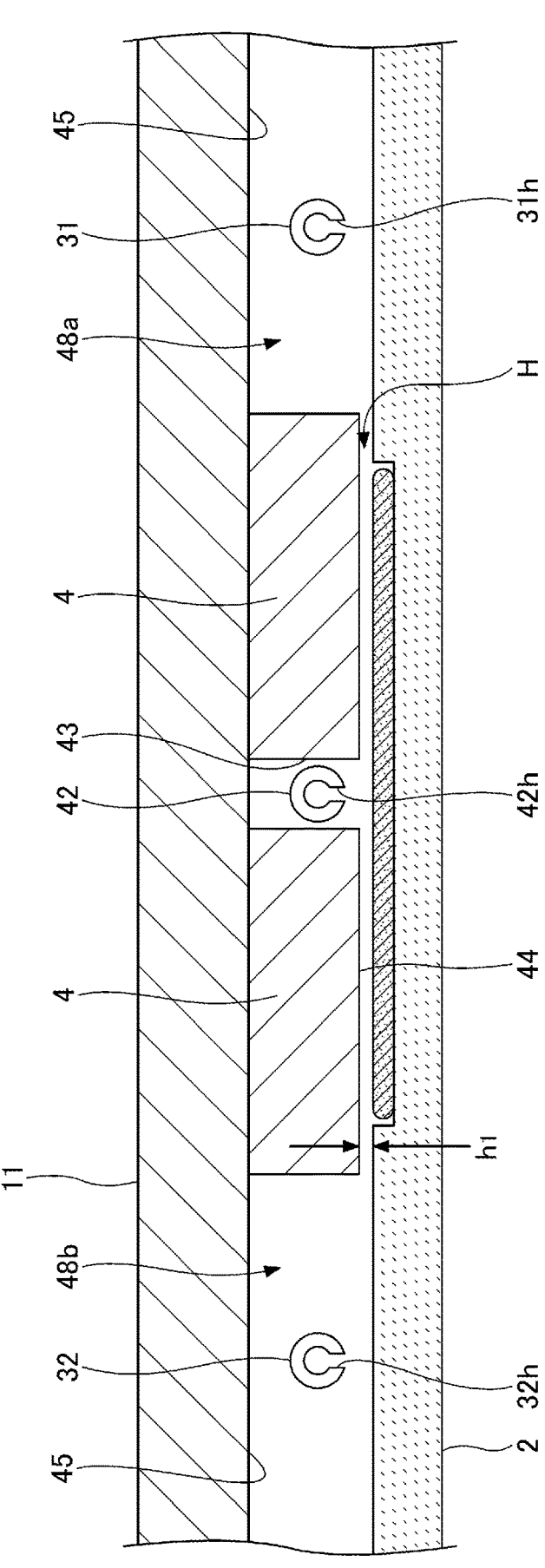
FIG. 4 is a cross-sectional view illustrating a vacuum chamber along a circumferential direction of a rotary table.

FIG. 4 illustrates a cross section of the vacuum chamber 1 along the concentric circle of the rotary table 2 from the reaction gas nozzle 31 to the reaction gas nozzle 32. As illustrated in FIG. 4, the projecting portion 4 is attached to the back surface of the top plate 11. Therefore, in the vacuum chamber 1, there are a flat low ceiling surface (a first ceiling surface 44), which is the lower surface of the projecting portion 4, and a ceiling surface (a second ceiling surface 45), which is higher than the first ceiling surface 44 and is located on both circumferential sides of the first ceiling surface 44. The first ceiling surface 44 has a fan shape in a planar view with the apex of the fan shape being cut in an arc shape. As illustrated, a groove 43 is formed in the projecting portion 4 at the center of the circumferential direction so as to extend in the radial direction, and the separation gas nozzle 42 is accommodated in the groove 43. Another groove 43 is similarly formed in the other projecting portion 4, and the separation gas nozzle 41 is accommodated in the groove 43. The reaction gas nozzles 31 and 32 are respectively provided in the space below the second ceiling surface 45. The reaction gas nozzles 31 and 32 are provided in the vicinity of the substrate W away from the second ceiling surface 45. As illustrated in FIG. 4, the reaction gas nozzle 31 is provided in a space 48a below the second ceiling surface 45 on the right of the projecting portion 4, and the reaction gas nozzle 32 is provided in a space 48b below the second ceiling surface 45 on the left.

The first ceiling surface 44 forms a separation space H, which is a narrow space, with respect to the rotary table 2. When the separation gas is supplied from the discharge holes 42h of the separation gas nozzle 42, the separation gas flows through the separation space H toward the spaces 48a and 48b. Because the volume of the separation space H is smaller than that of the spaces 48a and 48b, the pressure of the separation space H can be higher compared to the pressure of the spaces 48a and 48b, by the separation gas. That is, the separation space H with high pressure is formed between the spaces 48a and 48b. The separation gas flowing from the separation space H to the spaces 48a and 48b acts as a counterflow for the organic raw material gas from the adsorption region P1 and the oxygen-containing gas from the oxidation region P2. Therefore, the organic raw material gas from the adsorption region P1 and the oxygen-containing gas from the oxidation region P2 are separated by the separation space H. Therefore, the mixing and reaction of the organic raw material gas and the oxygen-containing gas in the vacuum chamber 1 can be reduced.

A height h1 of the first ceiling surface 44 relative to the upper surface of the rotary table 2 is set to a height suitable for making the pressure in the separation space H higher compared to the pressure in the spaces 48a and 48b, considering the pressure in the vacuum chamber 1 during film formation, the rotational speed of the rotary table 2, the flow rate of the separation gas, and the like.

On the lower surface of the top plate 11, a protrusion 5 (FIG. 2 and FIG. 3) is provided surrounding the outer circumference of the core 21 for fixing the rotary table 2. The protrusion 5 is continuous with the part of the projecting portion 4 on the side of the center of rotation, and its lower surface is formed at the same height as the first ceiling surface 44.

Figure 5:
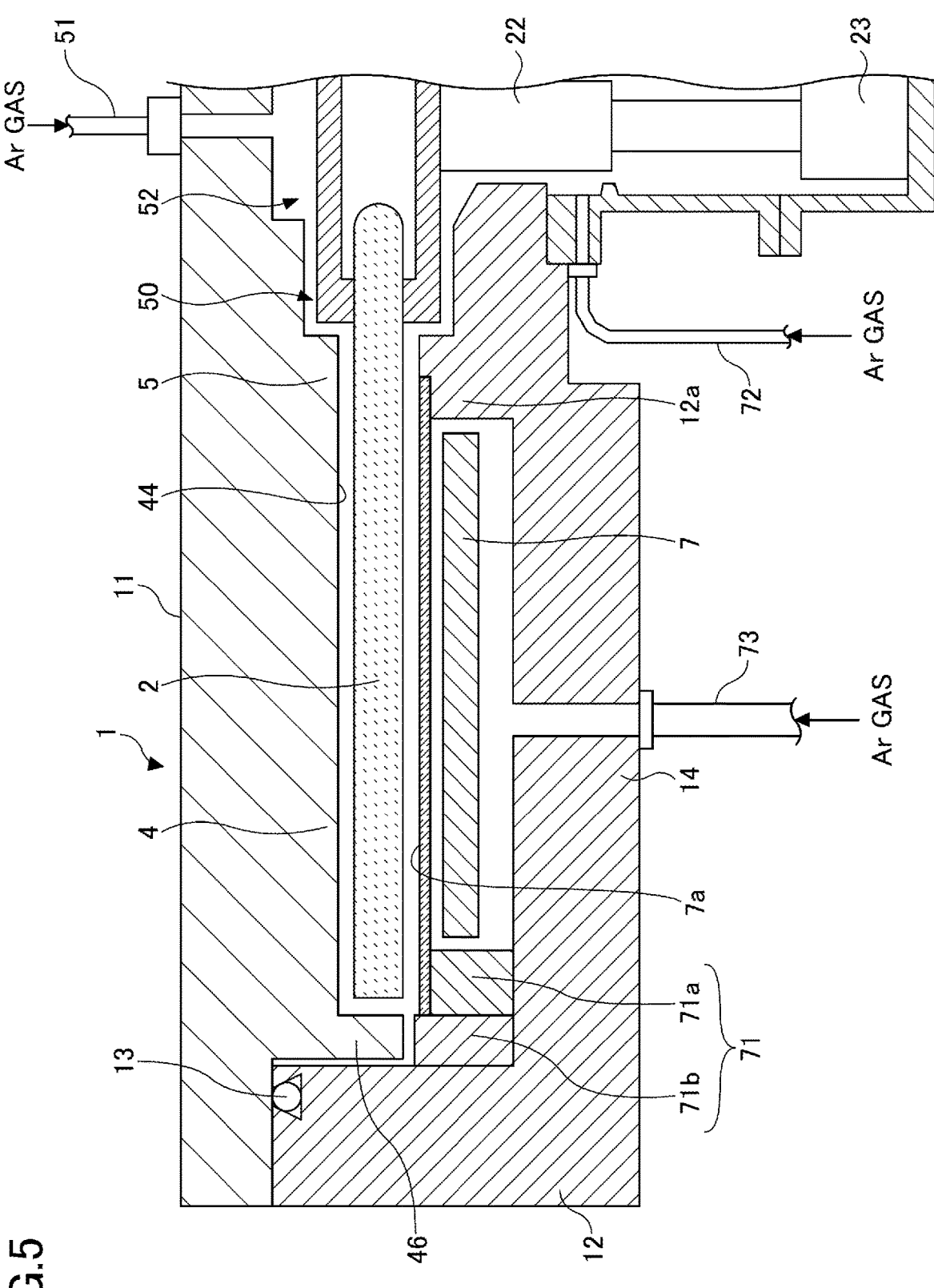
FIG. 5 is a cross-sectional view illustrating the vacuum chamber along a radial direction of the rotary table.

FIG. 1, referred to above, is a cross-sectional view along the I-I' line of FIG. 3, illustrating the region where the second ceiling surface 45 is provided. FIG. 5 is a cross-sectional view illustrating the region where the first ceiling surface 44 is provided. As illustrated in FIG. 5, a bend 46 that bends in an L-shape so as to face the outer end surface of the rotary table 2 is formed on the peripheral edge of the fan-shaped projecting portion 4 (the part on the outer edge of the vacuum chamber 1). Similar to the projecting portion 4, the bend 46 prevents the reaction gas from entering from both sides of the separation regions D1 and D2 and reduces mixing of the organic raw material gas and the oxygen-containing gas. Because the fan-shaped projecting portion 4 is provided on the top plate 11 and the top plate 11 can be removed from the chamber body 12, there is a slight gap between the outer peripheral surface of the bend 46 and the chamber body 12. The gap between the inner peripheral surface of the bend 46 and the outer peripheral surface of the rotary table 2, and the gap between the outer peripheral surface of the bend 46 and the chamber body 12 are set to the same dimensions as, for example, the height of the first ceiling surface 44 relative to the upper surface of the rotary table 2.

The inner peripheral wall of the chamber body 12 in the separation regions D1 and D2 is formed in a vertical plane close to the outer peripheral surface of the bend 46 (FIG. 5). The inner peripheral wall of the chamber body 12 in the regions other than the separation regions D1 and D2 is recessed outward, for example, from the part opposite to the outer end surface of the rotary table 2 to the bottom 14 (FIG. 1). Hereinafter, for convenience of explanation, the recessed area having a generally rectangular cross-sectional shape is referred to as an exhaust region E. Specifically, the exhaust region communicating with the adsorption region P1 is referred to as a first exhaust region E1, and the region communicating with the oxidation region P2 is referred to as a second exhaust region E2. A first exhaust port 61 and a second exhaust port 62 are formed at the bottom of the first exhaust region E1 and the second exhaust region E2, respectively, as illustrated in FIGS. 1 to 3. The first exhaust port 61 and the second exhaust port 62 are connected to a vacuum pump 64 via an exhaust pipe 63, respectively, as illustrated in FIG. 1. The exhaust pipe 63 is provided with a pressure controller 65.

A heater unit 7 is provided in the space between the rotary table 2 and the bottom 14 of the vacuum chamber 1, as illustrated in FIGS. 1 and 5. The substrate W on the rotary table 2 is heated via the rotary table 2 to the temperature determined in the process recipe. A ring-shaped cover member 71 is provided below the vicinity of the periphery of the rotary table 2 (FIG. 5). The cover member 71 divides the atmosphere from the upper space of the rotary table 2 to the first exhaust region E1 and the second exhaust region E2 and the atmosphere in which the heater unit 7 is placed, to prevent gas from entering the region below the rotary table 2. The cover member 71 includes an inner member 71a provided so as to face from below the outer edge of the rotary table 2 and the outer circumference of the outer edge, and an outer member 71b provided between the inner member 71a and the inner peripheral surface of the vacuum chamber 1. The outer member 71b is provided close to the bend 46 below the bend 46 formed at the outer edge of the projecting portion 4 in the separation regions D1 and D2. The inner member 71a surrounds the heater unit 7 all over its circumference below the outer edge of the rotary table 2 (and below the area slightly outside the outer edge).

The part of the bottom 14 that is closer to the rotation center than the space where the heater unit 7 is placed projects upward to approach the core 21 near the center of the lower surface of the rotary table 2, forming a protrusion 12a. The space between the protrusion 12a and the core 21 is narrow, and the gap between the inner peripheral surface of the through hole of the rotating shaft 22 penetrating the bottom 14 and the rotating shaft 22 is narrow, and these narrow spaces communicate with the case body 20. The case body 20 is provided with a purge gas supply pipe 72 for purging the purge gas by supplying it into the narrow spaces. The bottom 14 of the vacuum chamber 1 is provided with a plurality of purge gas supply pipes 73 for purging the space where the heater unit 7 is placed, at predetermined angular intervals in the circumferential direction below the heater unit 7. FIG. 5 illustrates one purge gas supply pipe 73. Between the heater unit 7 and the rotary table 2, a lid member 7a is provided to circumferentially cover the space between the inner peripheral wall of the outer member 71b (the upper surface of the inner member 71a) and the upper end of the protrusion 12a in order to prevent the gas from entering into the region where the heater unit 7 is provided. The lid member 7a is formed of, for example, quartz.

A separation gas supply pipe 51 is connected to the center of the top plate 11 of the vacuum chamber 1. The separation gas supply pipe 51 supplies the separation gas to a space 52 between the top plate 11 and the core 21. The separation gas supplied to the space 52 is discharged toward the periphery along the surface on the side of the substrate placement area of the rotary table 2, through a narrow gap 50 between the protrusion 5 and the rotary table 2. The gap 50 can be maintained at a higher pressure than the spaces 48a and 48b by the separation gas. Therefore, the gap 50 prevents mixing of the organic raw material gas supplied to the adsorption region P1 and the oxygen-containing gas supplied to the oxidation region P2, through the central region C. That is, the gap 50 (or the central region C) functions similarly to the separation space H (or the separation regions D1 and D2).

On the sidewall of the vacuum chamber 1, as illustrated in FIGS. 2 and 3, a loading port 15 is formed to transfer the substrate W between the external transfer arm 10 and the rotary table 2. The loading port 15 is opened and closed by a gate valve (not illustrated). Below the rotary table 2, at a position corresponding to the transfer position of the substrate W, a lifting pin for lifting the substrate W from the back surface through the recess 24 when transferring and its lifting mechanism are provided (not illustrated).

The deposition apparatus is provided with a controller 100. The controller 100 includes a computer for controlling the operation of the entire apparatus as illustrated in FIG. 1. In the memory of the controller 100, a program is stored to cause the deposition apparatus to perform the deposition method described later, under the control of the controller 100. The program has a group of steps to perform the deposition method described later. The program is stored in a medium 102 such as a hard disk, a compact disk, a magneto-optical disk, a memory card, a flexible disk, and the like, and is read into a storage 101 by a predetermined reader and installed in the controller 100.

Figure 6:
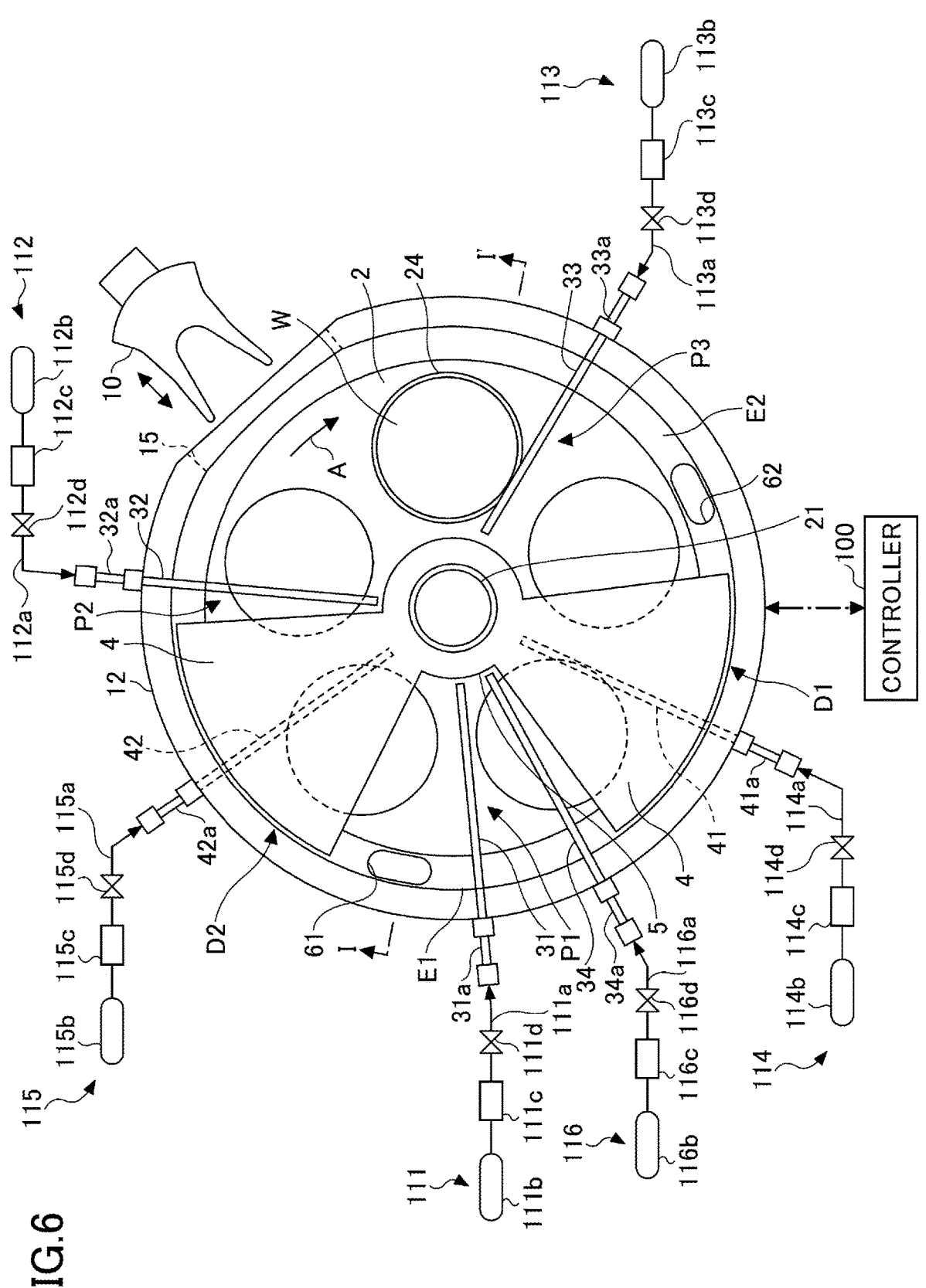
FIG. 6 is a planar view illustrating another configuration example of the deposition apparatus according to an embodiment.

With reference to FIG. 6, another configuration example of the deposition apparatus according to the embodiment will be described. FIG. 6 is a planar view illustrating another configuration example of the deposition apparatus according to the embodiment.

The deposition apparatus illustrated in FIG. 6 differs from the deposition apparatus illustrated in FIGS. 1 to 5 in that a dehydrating agent nozzle 34 is provided between the separation gas nozzle 41 and the reaction gas nozzle 31 in the circumferential direction of the vacuum chamber 1. The following explanation focuses on the differences from the deposition apparatus illustrated in FIGS. 1 to 5.

A gas introduction port 34*a*, which is the proximal end of the dehydrating agent nozzle 34, is fixed to the outer circumferential wall of the chamber body 12. The dehydrating agent nozzle 34 is introduced into the vacuum chamber 1 from the outer circumferential wall of the vacuum chamber 1, and is attached so as to extend horizontally against the rotary table 2 along the radial direction of the chamber body 12.

A dehydrating agent is introduced into the dehydrating agent nozzle 34 from a dehydrating agent supplier 116. The dehydrating agent supplier 116 includes a dehydrating agent supply path 116*a*, a dehydrating agent source 116*b*, a flow controller 116*c*, and a valve 116*d*. The dehydrating agent supply path 116*a* is provided outside the vacuum chamber 1. The dehydrating agent supply path 116*a* is connected to the dehydrating agent nozzle 34. The dehydrating agent supply path 116*a* is provided with the dehydrating agent source 116*b*, the flow controller 116*c*, and the valve 116*d* in the order from upstream to downstream in the gas flow direction. Accordingly, the dehydrating agent from the dehydrating agent source 116*b* is controlled in supply timing by the valve 116*d*, and is adjusted to a predetermined flow rate by the flow controller 116*c*. The dehydrating agent flows from the dehydrating agent supply path 116*a* into the dehydrating agent nozzle 34, and is discharged from the dehydrating agent nozzle 34 into the vacuum chamber 1. The flow controller 116*c* may be, for example, a mass flow controller.

A plurality of dehydrating agent nozzles 34 may be provided at intervals in the circumferential direction of the vacuum chamber 1. In this case, the dehydrating agent supplier 116 is configured to introduce the dehydrating agent into the dehydrating agent nozzles 34.

In the deposition apparatus illustrated in FIG. 6, the dehydrating agent is introduced into the dehydrating agent nozzle 34 and not into the separation gas nozzle 41, but similar to the deposition apparatus illustrated in FIGS. 1 to 5, the dehydrating agent may be introduced into the dehydrating agent nozzle 34 and the separation gas nozzle 41. In this case, because the dehydrating agent can be supplied from both the dehydrating agent nozzle 34 and the separation gas nozzle 41, the effect of desorbing $H_2O$ adsorbed on the surface of the substrate W is enhanced.

(Deposition Method)

Figure 7:
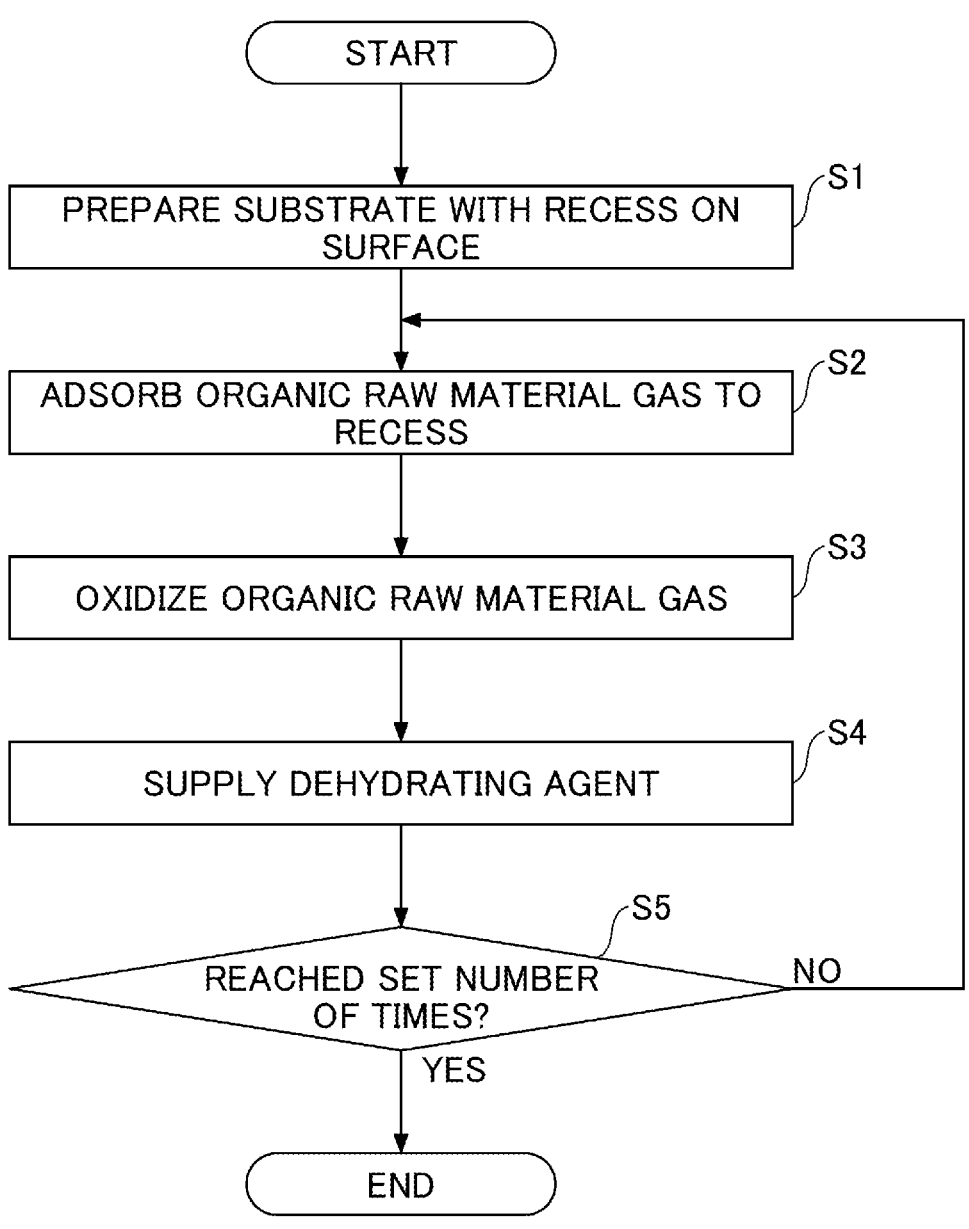
FIG. 7 is a flowchart illustrating an example of a deposition method according to an embodiment.
Figure 8:
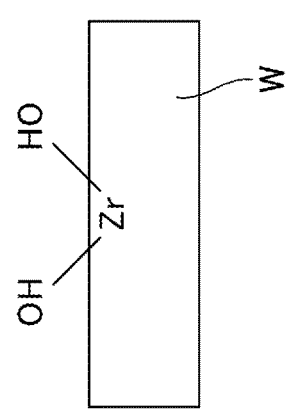
FIG. 8 is a schematic diagram illustrating an example of a deposition method according to an embodiment.
Figure 8:
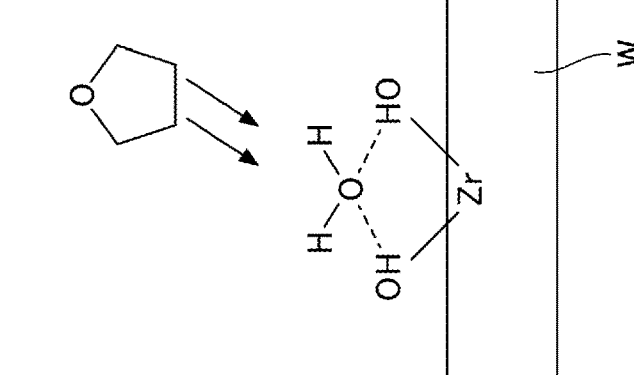

The deposition method according to the embodiment will be described with reference to FIGS. 7 and 8. FIG. 7 is a flowchart illustrating an example of the deposition method according to the embodiment. FIG. 8 is a schematic diagram illustrating an example of the deposition method according to the embodiment. The deposition method according to the embodiment includes steps S1 to S5 illustrated in FIG. 7.

In step S1, a substrate W with a recess on the surface is prepared. The substrate W may be, for example, a semiconductor wafer. The recess may be, for example, a trench or a hole.

Step S2 is performed after step S1. In step S2, the organic raw material gas is supplied to the surface of the substrate W, and the organic raw material gas is adsorbed to the recess. The organic raw material gas may be a gas containing, for example, metallic elements, carbon, and hydrogen. The metallic elements may be, for example, Al, Ti, Sr, Zr, or Hf. The organic raw material gas may be, for example, tris (dimethylamino)cyclopentadienyl zirconium gas. After step S2, a step of supplying an inert gas to the surface of the substrate W may be performed. In this case, the organic raw material gas not adsorbed on the recess is easily discharged.

Step S3 is performed after step S2. In step S3, the oxygen-containing gas is supplied to the surface of the substrate W to oxidize the organic raw material gas adsorbed in the recess. As a result, silicon oxide films are formed on the upper and inner surfaces of the recess of the substrate W. The oxygen-containing gas is a gas that oxidizes the organic raw material gas. The oxygen-containing gas may be, for example, a mixture of $H_2$ and $O_2$, $O_2$ gas, $H_2O$ gas, $O_3$ gas, a mixture of $H_2$ and $O_3$, NO gas, $N_2O$ gas, $NO_2$ gas, CO gas, and $CO_2$ gas. In step S3, carbon dioxide ($CO_2$), water ($H_2O$), and the like are generated by the reaction between the organic raw material gas adsorbed to the recess and the oxygen-containing gas. The $CO_2$ is easily exhausted and does not appreciably remain on the upper and inner surfaces of the recess. Because $H_2O$ is difficult to exhaust, a part of $H_2O$ remains on the upper and inner surfaces of the recess and adsorbs. For example, as illustrated in FIG. 8 (*a*), $H_2O$ remains on the surface of the substrate W and adsorbs.

Step S4 is performed after step S3. In step S4, a first gas containing a dehydrating agent is supplied to the surface of the substrate W. The dehydrating agent is a gas for desorbing moisture adsorbed on the surface of the substrate W. The dehydrating agent may be, for example, THF gas or dimethylamine gas. In step S4, $H_2O$ adsorbed on the upper and inner surfaces of the recess is desorbed by the dehydrating agent. For example, when the THF gas is supplied to the surface of the substrate W as illustrated in FIG. 8 (*a*), the THF gas acts on the $H_2O$ adsorbed on the surface of the substrate W as illustrated in FIG. 8 (*b*), and the $H_2O$ adsorbed on the surface of the substrate W is discharged with the desorbed THF gas as illustrated in FIG. 8 (*c*). Therefore, the surface from which the $H_2O$ is removed is formed on the substrate W as illustrated in FIG. 8 (*d*). The first gas may contain an inert gas. In this case, $H_2O$ desorbed by the dehydrating agent is easily discharged from the upper and inner surfaces of the recess. The flow rate of the inert gas may be larger than, for example, the flow rate of the dehydrating agent. In this case, $H_2O$ desorbed by the dehydrating agent is more easily evacuated from the upper and inner surfaces of the recess.

Step S5 is performed after step S4. In step S5, it is determined whether steps S2 to S4 are performed a set number of times. When the set number of times is not reached, steps S2 to S4 are performed again. When the set number of times is reached, the process is terminated. The set number of times of step S5 may be, for example, once or twice or greater. Hereinafter, the cycle including steps S2 to S4 is referred to as an ALD cycle.

The organic raw material gas has the property that the amount of adsorption increases on the surface where $H_2O$ is adsorbed. Therefore, in step S2 of the second and subsequent ALD cycles, when the amount of adsorption of $H_2O$ is different on the upper surface and the inner surface of the recess, the amount of adsorption of the organic raw material gas varies according to the amount of adsorption of $H_2O$, and the step coverage deteriorates. The reasons for the increase in the amount of adsorption of the organic raw material gas on the surface where $H_2O$ is adsorbed are considered as follows.

Figure 9:
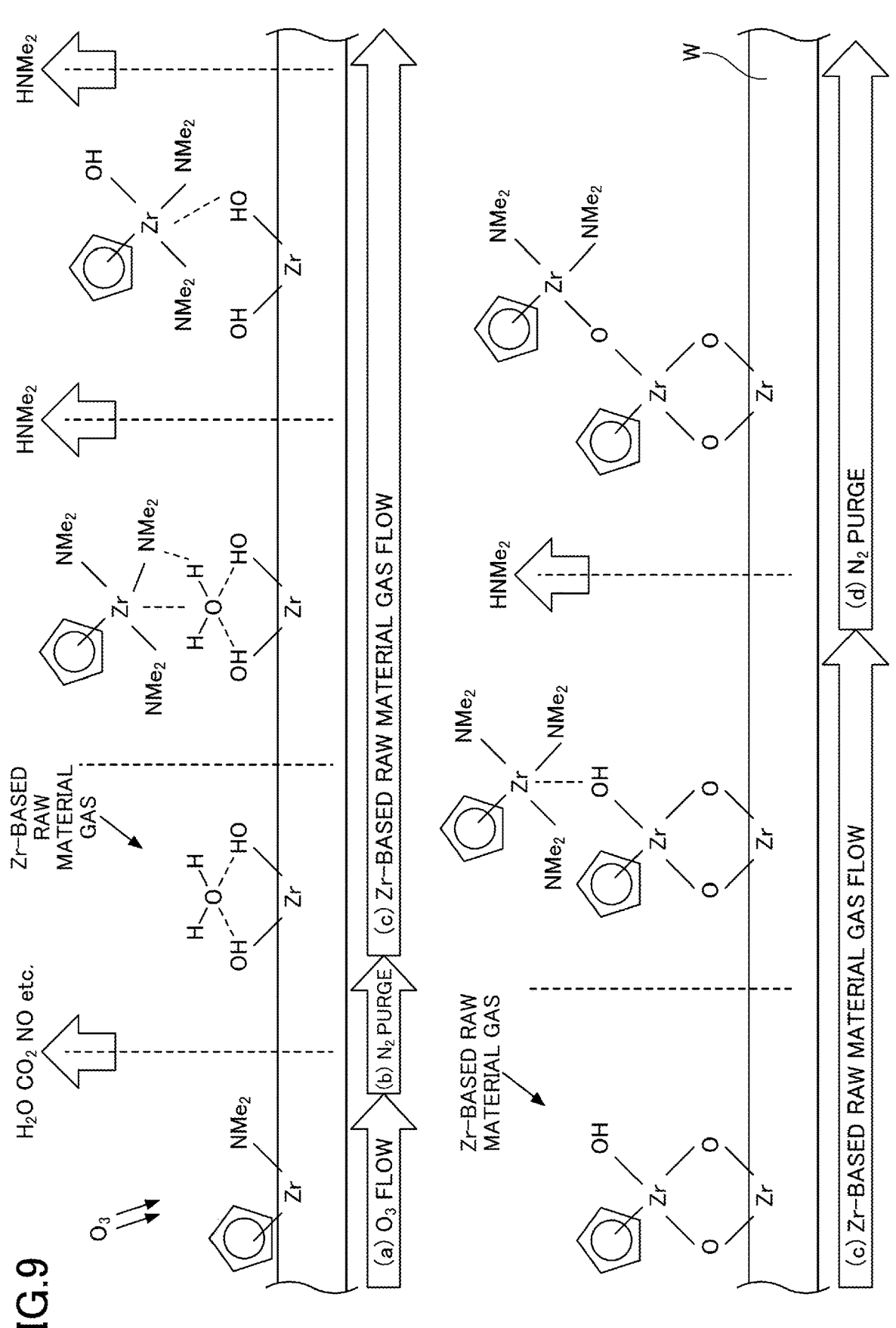
FIG. 9 is a schematic diagram illustrating a conventional deposition method.

FIG. 9 is a schematic diagram illustrating the conventional deposition method. The conventional deposition method does not have the aforementioned step S4. In the conventional deposition method, the step S2 and the step S3 are repeated until the set number of times is reached. Hereinafter, the conventional deposition method will be explained by exemplifying the case where the organic raw material gas is a Zr-based raw material gas containing Zr as a metallic element, the oxygen-containing gas is $O_3$ gas, and the inert gas is $N_2$ gas.

First, a Zr-based raw material gas is supplied to the surface of the substrate W, and the Zr-based raw material gas is adsorbed on the surface of the substrate W. Then, as illustrated in FIG. 9 (a), $O_3$ gas) is supplied to the surface of the substrate W on which the Zr-based raw material gas has been adsorbed. At this time, $H_2O$, $CO_2$, NO, and the like are generated by the reaction between the Zr-based raw material gas adsorbed on the surface of the substrate W and the $O_3$ gas). Then, as illustrated in FIG. 9 (b), $N_2$ gas is supplied to the surface of the substrate W. As a result, $H_2O$, $CO_2$, NO, and the like, generated by the reaction between the Zr-based raw material gas and the $O_3$ gas), are discharged. At this time, because $H_2O$ does not appreciably discharged compared with $CO_2$ and NO, a part of $H_2O$ remains on the surface of the substrate W and adsorbs. Then, as illustrated in (c) of FIG. 9, the Zr-based raw material gas is supplied to the substrate W in which $H_2O$ remains on the surface. The organic raw material gas such as the Zr-based raw material gas has the property of adsorbing on the surface with the OH group. Therefore, when the Zr-based raw material gas is supplied to the surface on which the $H_2O$ with the OH group is adsorbed, the $H_2O$ on the surface of the substrate W and the Zr-based raw material gas react to adsorb the Zr-based raw material gas, and the OH group is generated in the Zr-based raw material gas. The OH group formed in the Zr-based raw material gas reacts with another Zr-based raw material gas to further adsorb the Zr-based raw material gas on the surface. Thus, in one ALD cycle, the Zr-based raw material gas corresponding to two ALD cycles is adsorbed on the surface where $H_2O$ is adsorbed. Therefore, the film thickness is considered to be thicker on the surface where $H_2O$ is adsorbed than on the surface where $H_2O$ is not adsorbed. Then, as illustrated in FIG. 9 (d), $N_2$ gas, which is an example of an inert gas, is supplied to the surface of the substrate W. Accordingly, by-products generated by the reaction on the surface of the substrate W are discharged.

In the deposition method according to the embodiment, after the organic raw material gas is oxidized, the dehydrating agent is supplied to the surface of the substrate W to desorb $H_2O$ adsorbed on the upper and inner surfaces of the recess. Therefore, variations in the amount of adsorbed organic raw material gas on the upper and inner surfaces of the recess can be reduced in the second and subsequent ALD cycles. As a result, good step coverage can be obtained.

In the deposition method according to the embodiment, the first gas containing the dehydrating agent is used instead of the conventional inert gas as a gas supplied when the oxygen-containing gas is purged. Accordingly, variations in the amount of adsorbed organic raw material gas on the upper and inner surfaces of the recess can be prevented without extending the time of one ALD cycle. Therefore, good step coverage and high productivity can be achieved at the same time.

In contrast, when only the inert gas is used as the gas supplied when purging the oxygen-containing gas, $H_2O$ desorbed from the lower inner surface of the recess by the inert gas may be readsorbed on the upper inner surface of the recess or the upper surface of the recess when it is evacuated from the recess. As a result, the amount of $H_2O$ adsorbed on the upper inner surface of the recess or the upper surface of the recess becomes larger than that on the lower inner surface of the recess. Therefore, the amount of adsorbed organic raw material gas on the upper inner surface of the recess or the upper surface of the recess becomes larger than that on the lower inner surface of the recess. As a result, good step coverage is not obtained. It takes a long time to desorb $H_2O$ readsorbed on the upper inner surface of the recess or the upper surface of the recess, resulting in reduced productivity.

In addition, it is also possible to apply thermal energy to the substrate W to desorb $H_2O$ adsorbed on the upper and inner surfaces of the recess. In this case, it is not easy to selectively apply thermal energy to the region where $H_2O$ is adsorbed, and there may be a difference in film quality between the region where thermal energy is applied and the region where thermal energy is not applied. In addition, when thermal energy is applied, the temperature of the substrate W increases. Therefore, the cooling of the substrate W is performed after the thermal energy is applied. Therefore, the productivity is reduced.

Next, a case in which the deposition method according to the embodiment is performed in the deposition apparatus illustrated in FIGS. 1 to 5, and a silicon oxide film is formed in the recess formed on the surface of the substrate W is described.

First, the gate valve is opened, and the substrate W is transferred into the recess 24 of the rotary table 2 from the outside via the loading port 15 by the transfer arm 10. The transfer of the substrate W is performed by raising and lowering pins from the bottom side of the vacuum chamber 1 through a through hole in the bottom of the recess 24 when the recess 24 stops at a position facing the loading port 15. Such transfer of the substrate W is performed by intermittently rotating the rotary table 2, and the substrate W is placed in each of the five recesses 24 of the rotary table 2.

Subsequently, the gate valve is closed, and the inside of the vacuum chamber 1 is evacuated to a reachable degree of vacuum by the vacuum pump 64. Then, the separation gas is discharged from the separation gas nozzles 41 and 42 at a predetermined flow rate, the separation gas is discharged from the separation gas supply pipe 51 at a predetermined flow rate, and the purge gas is discharged from the purge gas supply pipe 72 at a predetermined flow rate. The dehydrating agent may be discharged with the separation gas from the separation gas nozzle 41 at a predetermined flow rate. Moreover, the inside of the vacuum chamber 1 is controlled to a preset processing pressure by the pressure controller 65. Then, the substrate W is heated by a heater unit 7 while rotating the rotary table 2 clockwise. The rotational speed of the rotary table 2 may be, for example, 1 rpm or more and 5 rpm or less, and in one example, 3 rpm. The temperature of the substrate W may be, for example, 200° C. or more and 300° C. or less, and in one example, 275° C.

Subsequently, the organic raw material gas is supplied from the reaction gas nozzle 31, and oxygen-containing gas is supplied from the reaction gas nozzle 33. When only the separation gas is supplied from the separation gas nozzle 41, the dehydrating agent is supplied from the separation gas nozzle 41 together with the separation gas.

By the rotation of the rotary table 2, the substrate W repeatedly passes through the adsorption region P1, the separation region D2, the oxidation region P3, and the separation region D1 in this order.

In the adsorption region P1, the organic raw material gas supplied from the reaction gas nozzle 31 is adsorbed on the upper and inner surfaces of the recess of the substrate W. In the separation region D2, the organic raw material gas not adsorbed on the recess of the substrate W is discharged. In the oxidation region P3, the organic raw material gas adsorbed on the upper and inner surfaces of the recess of the substrate W is oxidized by the oxygen-containing gas supplied from the reaction gas nozzle 33. As a result, a silicon oxide film is formed on the upper and inner surfaces of the recess of the substrate W. When the organic raw material gas is oxidized, $H_2O$ is produced as a by-product, and the produced $H_2O$ can be adsorbed on the surface of the silicon oxide film. In the separation region D1, $H_2O$ adsorbed on the surface of the silicon oxide film is desorbed by the dehydrating agent supplied from the separation gas nozzle 41.

When the substrate W reaches the adsorption region P1 again by the rotation of the rotary table 2, the organic raw material gas supplied from the reaction gas nozzle 31 is adsorbed on the upper and inner surfaces of the recess of the substrate W. At this time, because the $H_2O$ adsorbed on the upper and inner surfaces of the recess of the substrate W is desorbed, the variation of the adsorbed amount of the organic raw material gas on the upper and inner surfaces of the recess of the substrate W is small.

Subsequently, when the substrate W passes through the oxidation region P3, the organic raw material gas adsorbed on the upper and inner surfaces of the recess of the substrate W is oxidized by the oxygen-containing gas supplied from the reaction gas nozzle 33, and a silicon oxide film is further formed. At this time, the film thickness distribution of the silicon oxide film reflects the density of the organic raw material gas adsorbed on the upper and inner surfaces of the recess of the substrate W. Therefore, good step coverage can be obtained.

Subsequently, when the substrate W reaches the separation region D1 again, $H_2O$ adsorbed on the surface of the silicon oxide film is desorbed by the dehydrating agent supplied from the separation gas nozzle 41.

Thereafter, when the above processes are repeated, a silicon oxide film with good step coverage is formed on the upper and inner surfaces of the recess.

In the above example, the case where the oxygen-containing gas is supplied from the reaction gas nozzle 33 and the oxygen-containing gas is not supplied from the reaction gas nozzle 32 is explained, but there is no limitation to this case. For example, the oxygen-containing gas may be supplied from the reaction gas nozzle 32 and the reaction gas nozzle 33. In this case, because the effect of oxidizing the surface of the substrate W is large, a silicon oxide film with low impurity concentration can be formed. For example, the oxygen-containing gas may be supplied from the reaction gas nozzle 32 instead of the reaction gas nozzle 33.

As described above, according to the deposition method according to the embodiment, after the organic raw material gas is oxidized, the dehydrating agent is supplied to the surface of the substrate W to desorb $H_2O$ adsorbed on the upper and inner surfaces of the recess. Therefore, variations in the amount of adsorbed organic raw material gas on the upper and inner surfaces of the recess can be reduced in the second and subsequent ALD cycles. As a result, good step coverage is obtained.

According to the deposition method according to the embodiment, a first gas containing a dehydrating agent is used instead of the conventional inert gas as a gas to be supplied when purging the oxygen-containing gas. Accordingly, variations in the amount of adsorbed organic raw material gas on the upper and inner surfaces of the recess can be prevented without extending the time of one ALD cycle. Therefore, good step coverage and high productivity can be achieved at the same time.

According to the deposition method in the embodiment, the steps S2 to S4 are performed on the substrate W by rotating the rotary table 2 at a constant speed and passing the substrate W through the adsorption region P1, the oxidation region P3, and the separation region D1. Therefore, it is not easy to make the time of one step, for example, the step S4, longer than the time of the other steps S2 and S3. According to the deposition method according to the embodiment, $H_2O$ adsorbed on the upper and inner surfaces of the recess can be desorbed without extending the time of step S4. Therefore, the deposition method according to the embodiment is particularly effective in the deposition device according to the aforementioned embodiment. However, the deposition method in the embodiment can also be applied to a single-sheet device that processes one substrate W at a time or a batch device that processes multiple substrates W at once.

EXAMPLES

The following describes an example in which it was confirmed that a good step coverage can be obtained when a silicon oxide film is formed in the recess formed on the surface of the substrate in the deposition device of the embodiment. In the example, a silicon oxide film is formed in the recess under the following Conditions 1 to 4, and the step coverage and overhang of the silicon oxide film are evaluated.

Figure 10:
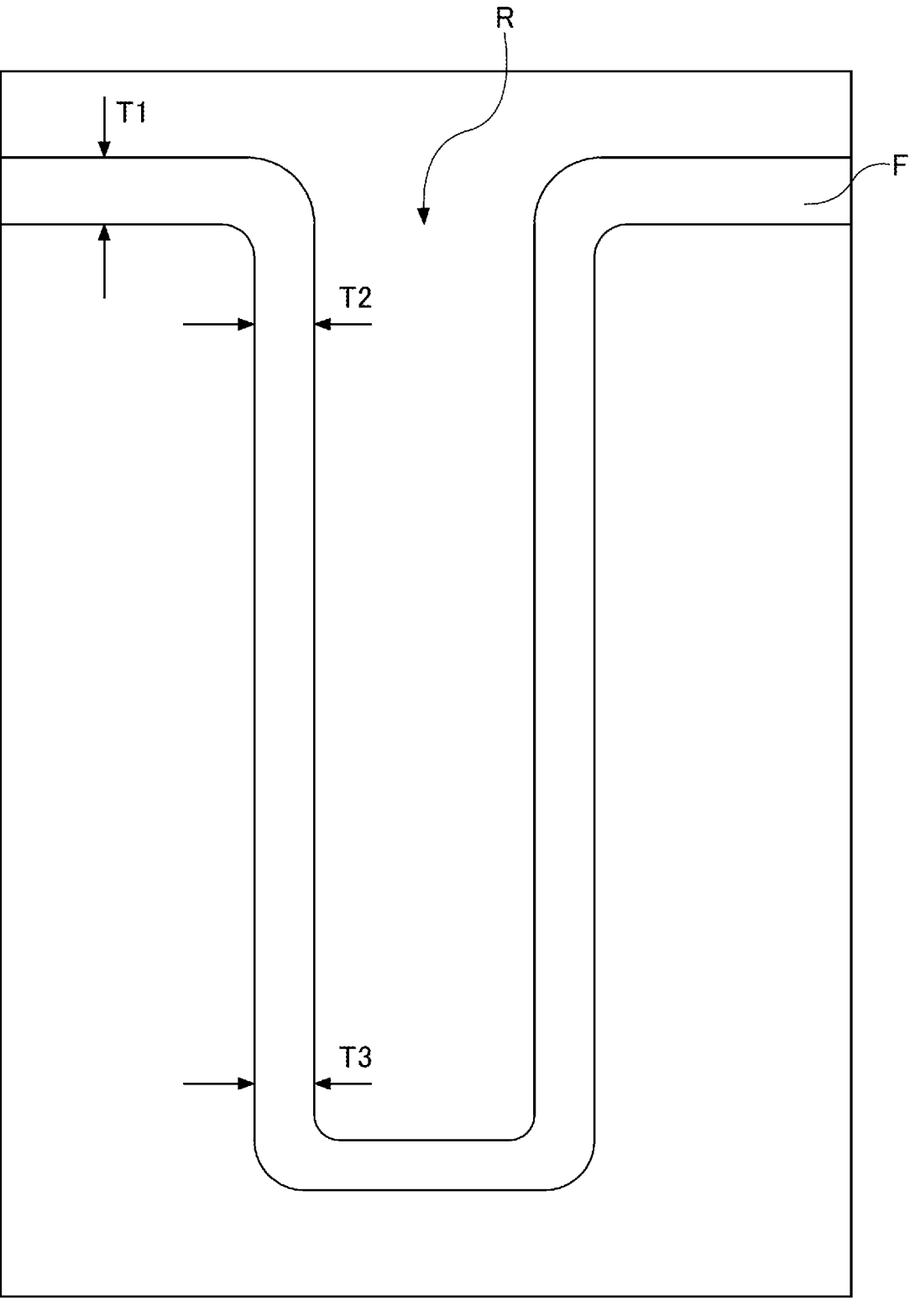
FIG. 10 is a diagram illustrating an evaluation method of embedding characteristics of the silicon oxide film.

FIG. 10 is a diagram illustrating the evaluation method of the embedding characteristics of the silicon oxide film. FIG. 10 is a diagram explaining the overhang and step coverage of the silicon oxide film F formed in the recess R.

The overhang is the value calculated by T1/T2 when T1 is the thickness of the silicon oxide film F formed on the upper surface of the recess R, and T2 is the thickness of the silicon oxide film F formed on the upper inner surface of the recess R. The closer the overhang is to 100%, the smaller the difference between the thickness T1 of the silicon oxide film F formed on the upper surface of the recess R and the thickness T2 of the silicon oxide film F formed on the upper inner surface of the recess R, which means a better overhang.

The step coverage is the value calculated by T3/T2, where T2 is the thickness of the silicon oxide film F formed on the upper inner surface of the recess R, and T3 is the thickness of the silicon oxide film F formed on the lower inner surface of the recess R. The closer the step coverage is to 100%, the smaller the difference between the thickness T2 of the silicon oxide film F formed on the upper inner surface of the recess R and the thickness T3 of the silicon oxide film F formed on the lower inner surface of the recess R, which means that a better step coverage is obtained.

(Condition 1)

In Condition 1, a silicon oxide film was formed in the recess by supplying gas from each nozzle while rotating the rotary table 2 on which the substrate was mounted. Specifically, zirconium-containing gas, which is an example of the organic raw material gas, was supplied from the reaction gas nozzle 31, ozone gas, which is an example of the oxygen-containing gas, was supplied from the reaction gas nozzle 33, and nitrogen gas, which is an example of the separation gas, was supplied from the separation gas nozzle 42. THF gas, which is an example of the dehydrating agent, was supplied from the separation gas nozzle 41 at a flow rate of 1 slm, and nitrogen gas, which is an example of the separation gas, was supplied from the separation gas nozzle 41 at a flow rate of 3 slm. The cross section of the substrate was observed by a transmission electron microscope (TEM), and the overhang and step coverage of the silicon oxide film were calculated based on the cross section image.

(Condition 2)

In Condition 2, with respect to Condition 1, the flow rate of nitrogen gas supplied from the separation gas nozzle 41 was changed from 3 slm to 5 slm, and a silicon oxide film was formed in the recess. The other conditions are the same as in Condition 1. In addition, as in Condition 1, the cross section of the substrate was observed by TEM, and the overhang and step coverage of the silicon oxide film were calculated based on the cross section image.

(Condition 3)

In Condition 3, with respect to Condition 1, the flow rate of nitrogen gas supplied from the separation gas nozzle 41 was changed from 3 slm to 10 slm, and a silicon oxide film was formed on the recess. The other conditions are the same as in Condition 1. In addition, as in Condition 1, the cross section of the substrate was observed by TEM, and the overhang and step coverage of the silicon oxide film were calculated based on the cross section image.

(Condition 4)

In Condition 4, with respect to Condition 1, a silicon oxide film was formed in the recess by supplying only nitrogen gas without supplying THF gas from the separation gas nozzle 41. The other conditions are the same as in Condition 1. In addition, as in Condition 1, the cross section of the substrate was observed by TEM, and the overhang and step coverage of the silicon oxide film were calculated based on the cross section image.

FIG. 11 illustrates the evaluation results of the embedding characteristics of the silicon oxide film. FIG. 11 illustrates the calculation results of the overhang and step coverage of the silicon oxide film formed in the recess under Conditions 1 to 4.

As illustrated in FIG. 11, it can be seen that under Conditions 1 to 3, the value of the overhang and step coverage is closer to 100% compared to Condition 4. The results illustrate that good overhang and good step coverage can be obtained by supplying THF and nitrogen gases from the separation gas nozzle 41.

Also, as illustrated in FIG. 11, it can be seen that under Condition 3, the overhang and step coverage are closer to 100% than under Conditions 1 and 2. The results illustrate that the overhang and step coverage are further improved by increasing the flow rate of nitrogen gas supplied from the separation gas nozzle 41.

The embodiments disclosed herein should be considered in all respects exemplary and not restrictive. The above embodiments may be omitted, substituted, or modified in various forms without departing from the scope and intent of the attached claims.

According to the present disclosure, good step coverage and high productivity can be achieved at the same time.

What is claimed is:

1. A deposition method comprising:

a step (a) of preparing a substrate with a recess on a surface thereof;

a step (b) of supplying an organic raw material gas to the surface to adsorb the organic raw material gas to the recess;

a step (c) of supplying an oxygen-containing gas to the surface to oxidize the organic raw material gas adsorbed to the recess; and a step (d), after the step (c), of supplying a first gas containing a dehydrating agent to the surface, wherein the dehydrating agent includes a tetrahydrofuran gas.

2. The deposition method according to claim 1, wherein the step (b), the step (c), and the step (d) are repeated multiple times in this order.

3. The deposition method according to claim 1, wherein the step (c) includes adsorbing $H_2O$ to the surface, and the step (d) includes desorbing $H_2O$ adsorbed to the surface.

4. The deposition method according to claim 1, wherein the first gas includes an inert gas.

5. The deposition method according to claim 1, further comprising:

a step (e), between the step (b) and the step (c), of supplying an inert gas to the surface.

6. The deposition method according to claim 1, wherein the substrate is placed on a rotary table in a vacuum chamber along a circumferential direction, the vacuum chamber includes an adsorption region where the step (b) is performed, an oxidation region where the step (c) is performed, and a dehydration region where the step (d) is performed, above the rotary table along a rotation direction of the rotary table, and the step (b), the step (c), and the step (d) are performed by rotating the rotary table in a state where the organic raw material gas is supplied to the adsorption region, the oxygen-containing gas is supplied to the oxidation region, and the first gas is supplied to the dehydration region.

7. A deposition apparatus comprising:

a vacuum chamber;

a gas supplier configured to supply a gas into the vacuum chamber; and a controller, wherein the controller is configured to control the gas supplier to perform:

a step (a) of preparing a substrate with a recess on a surface thereof;

a step (b) of supplying an organic raw material gas to the surface to adsorb the organic raw material gas to the recess;

a step (c) of supplying an oxygen-containing gas to the surface to oxidize the organic raw material gas adsorbed to the recess; and a step (d), after the step (c), of supplying a first gas containing a dehydrating agent to the surface, wherein the dehydrating agent includes a tetrahydrofuran gas.

* * * * *